(12) United States Patent
Martin et al.

(10) Patent No.: US 6,639,313 B1
(45) Date of Patent: Oct. 28, 2003

(54) HERMETIC SEALS FOR LARGE OPTICAL PACKAGES AND THE LIKE

(75) Inventors: John R. Martin, Foxborough, MA (US); Kieran H. Harney, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/102,230

(22) Filed: Mar. 20, 2002

(51) Int. Cl.[7] .............................................. H01L 23/12
(52) U.S. Cl. ...................... 257/704; 257/432; 257/680; 257/711
(58) Field of Search .................. 257/704, 432–434, 257/686, 680–682, 693, 698, 711–737, 728, 778–780

(56) References Cited

U.S. PATENT DOCUMENTS

| | | | |
|---|---|---|---|
| 5,604,160 A | | 2/1997 | Warfield |
| 6,303,986 B1 | * | 10/2001 | Shook .......................... 257/680 |
| 6,384,353 B1 | * | 5/2002 | Huang et al. ................ 200/181 |
| 6,384,473 B1 | * | 5/2002 | Peterson et al. ............. 257/680 |
| 6,400,009 B1 | * | 6/2002 | Bishop et al. ............... 257/704 |
| 6,433,411 B1 | * | 8/2002 | Degani et al. .............. 257/678 |
| 6,441,481 B1 | * | 8/2002 | Karoman .................... 257/711 |
| 6,469,909 B2 | * | 10/2002 | Simmons ..................... 361/803 |
| 6,489,670 B1 | * | 12/2002 | Peterson et al. ............ 257/686 |
| 6,495,895 B1 | * | 12/2002 | Peterson et al. ............ 257/434 |
| 2002/0089044 A1 | * | 7/2002 | Simmons et al. ............ 257/668 |
| 2002/0181838 A1 | * | 12/2002 | Cunningham et al. ........ 385/16 |

OTHER PUBLICATIONS

"Principles of Seamwelding", Benchmark International, Inc.; 1997.

"Sealing techniques used for hermetic sealing of ceramic packages metal sealing technologies".

"Low cost packaging for accelerometers"; Electronic Packaging & Production.

Audet, Sarah A. et al; "Integrated sensor wafer–level packaging"; 1997 IEEE; Transducers '97; 1997 International conference on solid–state sensors and actuators, Chicago, Jun. 16–19, 1997.

Cohn, Michael B., "Research Report—Assembly Techniques for MEMS"; Berkeley Sensor & Actuator Center, Mar. 1997.

(List continued on next page.)

*Primary Examiner*—David Nelms
*Assistant Examiner*—Andy Huynh
(74) *Attorney, Agent, or Firm*—Wolf, Greenfield & Sacks, PC

(57) ABSTRACT

A MEMS product, particularly an optical MEMS product, and seal therefor. A housing member forms a cavity; a MEMS device is disposed in the cavity; a cap member (which may be an optical window) is dimensioned and configured to substantially cover the cavity; and a sealing member is sealingly attached to and between the housing member and the cap member. The sealing member may have a first attachment portion operatively attached by a first hermetic seal to the housing member and a second attachment portion operatively attached to the cap member by a second hermetic seal and the sealing member is impermeable to gas flow, whereby the cavity is hermetically sealed from ambient atmosphere external to the product. The sealing member is sufficiently resilient to allow motion due to differential thermal expansion between the housing member and the cap member without breaking either sealing attachment and further allowing the cap member to move in response to changes in barometric pressure, preferably with minimal tilting. The sealing member may comprise a ring element or member between the cavity housing and the window, and may take the form of a bellows formed of, e.g., nickel alloy, with a flexible portion intermediate two end attachment portions.

9 Claims, 2 Drawing Sheets

OTHER PUBLICATIONS

Cohn, Michael B. et al, "Microassembly technologies for MEMS", SPIE Micromachining and Microfabrication, Santa Clara, CA, Sep. 20–21, 1998 (PLENARY TALK).

Cohn, Michael B. et al, "Vacuum encapsulation using micromachined caps".

Cohn, Michael B. et al, "Wafer–to–Wafer transfer of microstructures for vacuum packaging", Depts of electrical engineering & computer science and mechanical engineering, Berkeley Sensor & Actuator Center, Berkeley, CA; Hilton Head '96.

Dixon, John, "Wafer level accelerometer capping", May 29, 1997.

Gilleo, Ken, Dr., "MEMS packaging issues and materials", Cookson Electronics; Advancing Microelectronics, Nov./Dec. 2000, pp 9–14.

Glenn, T.P. et al, "Packaging the micro–machine"; Amkor Technology.

Hsu, Tai–Ran, "MEMS demand—new package designs"; San Jose State Univ, CA; Semiconductor International, Apr. 2001.

Kelly, G. et al, "Microsystem packaging: lessons from conventional low cost IC packaging", National Microelectronics Research Center, Univ College, Lee Maltings, Prospect Row, Cork, Ireland; IOP Publishing Ltd; presented Oct. 22, 1996, accepted for publication May 29, 1997, pp 99–103.

Kniffin, Margaret L. et al, "packaging for silicon micromachined accelerometers", The International Society for Hybrid Microelectronics, vol. 19, No. 1, $1^{st}$ Quarter 1996, pp 75–85.

Leedecke, C.J. et al, "Glass–to–metal seals", Olin Corporation; White Papers, Aug. 9, 1999, pp 1–9.

Liang, Yiching et al, "Wafer–to–wafer transfer for microstructures", Berkeley Sensor & Actuator Center, U.C. Berkeley, CA; IAB, Mar. 1996.

Malshe, Ajay P. et al, "Challenges in the packaging of MEMS"; International Microelectronics and Packaging Society, vol. 22, No. 3, third quarter 1999, pp 233–240.

Migl, Travis W., "Interfacing to the digital micromirror device for home entertainment applications", ASME; Proceedings of IPACK '01, Jul. 8–13, 2001, Kauai, Hawaii.

Mirza, A.R., "Silicon wafer bonding: key to MEMS high-volume manufacturing"; SENSORS, Dec. 1998, pp 24–33.

O'Connor, John Patrick, "Packaging design considerations and guidelines for the digital micromirror device", Texas Instruments, Inc.; Proceedings of IPACK '01, Jul. 8–13, 2001, Kauai, Hawaii.

Renard, Stephane et al, "Wafer level surface mountable chip size packaging for MEMS and ICs", TRONIC'S Microsystems; VLSI Packaging Workshop, Cork, May 8–9, 2000.

* cited by examiner

HERMETIC SEALS FOR LARGE OPTICAL PACKAGES AND THE LIKE

FIELD OF THE INVENTION

This invention relates to the field of packaging of microelectronic and microelectro-mechanical systems (MEMS) devices. More particularly, it relates to establishment of a hermetic seal for a cover (such as an optical window) on a package for a microelectronic device such as an optical microelectronic or MEMS product, particularly a large package.

BACKGROUND OF THE INVENTION

The packaging of micro devices such as microelectronic devices, micromechanical devices and microelectro-mechanical systems is a complex field of endeavor. Within that field, the packaging of microelectro-mechanical systems presents even greater challenges than does the packaging of standard semiconductor (microelectronic) devices such as integrated circuits (ICs). MEMS typically include not only electronic circuitry such as may be found in conventional ICs, but also moving, micro-machined structures such as micromirrors, switches, multiplexers, cross-connects, optical filters and attenuators. In addition to the usual packaging needs of supporting and protecting devices, allowing for electrical interconnection and dissipating heat, MEMS products also require that their packaging permit free movement of the micro-structures, allow interaction of those micro-structures with the environment in some fashion appropriate to the particular product, and provide environmental protection for the devices. Typically, a MEMS device is packaged in a housing formed by a first member which establishes a cavity for receiving the device and which has an aperture (through which the MEMS device is inserted) which is closed by a second member that acts as a cap (also called a lid or cover and, in the case of an optical MEMS, a window or optical window). The cavity-forming member often is made of a ceramic material (e.g., alumina) and its coefficients of expansion in the plane of an attachment surface usually are close to those of the materials (typically silicon-based) of which the attached MEMS device is manufactured. By matching those expansion coefficients fairly closely, the shear strength of the adhesive securing the MEMS device to the housing is not exceeded as the temperature of the assembly varies.

Thermal expansion mismatch between the housing material and the cap material also is of concern because such mismatch places stresses on the joint between those two elements. Those stresses may be sufficient to break the attachment between the housing and cap, or to stress the cap to the point it cracks or develops unwanted conditions.

When the MEMS device is optical in nature and operates with an optical input and/or output signal, then the interaction with the environment involves the passage of light into and/or out of the device. The packaging for such an optical MEMS device must permit the ingress/egress of the optical signal(s) with minimal loss and distortion (such as dispersion or undesired refraction). For this purpose, the cap is made of a transparent material, such as a glass, to provide an optical window closing the cavity. Mating and fastening the cap to the cavity housing member is not a simple matter. For example, the MEMS product may require a hermetically sealed environment to keep out humidity and elements that may degrade performance or life, or the MEMS product may need to be kept in a special atmosphere which one does not want to leak out. Typically, such a seal thus must be impervious to gaseous contaminants that could impede the operation of the MEMS device if they leaked into the cavity. The seal between the cavity material and the optical window also must withstand a variety of mechanical stressors, such as vibration and thermal expansion differentials between the cavity housing and the optical window (lid), as well as changes in barometric pressure. The light being processed, in fact, can be one source of thermal energy that the window, the microstructure and other elements may absorb and convert to heat. Temperature cycling, moreover, can be expected to occur due to failures in thermal management systems and energy from nearby components, as well as other causes.

Not only must the seal be capable of withstanding the thermal stresses that may develop in shipping and operation, but also it must not introduce undesirable motion onto the optical window. Motion of the optical window can alter the refraction of the inbound or outbound beam(s) and cause the device to malfunction or at least to perform in an unplanned, undesired or degraded manner. Some motion is inherent due to thermal expansion and other mechanical forces such as barometric pressure changes. Controlling that motion is important. Barometric pressure changes produce forces acting in a z-axis direction (generally normal to the plane of a nominally flat cap), while thermal expansion of the materials produces forces primarily in the x- and y-axis directions (i.e., in or parallel to the plane of the cap). Barometric pressure changes occur not only in use, but also in shipment. It is important that a seal not fail or cause another part of the assembly to fail, and that neither a seal nor any other component be permanently altered in any adverse way during product shipment (e.g., by airplane). With respect to z-direction movement, it is most important at all times that the cap not tilt when it moves along the z-axis (e.g., in response to barometric pressure or internal gas pressure changes).

One approach employed previously is to solder seal a glass cap to the (typically ceramic) cavity housing. The seal material normally is a metal solder which is placed as a buffer between the glass cap and the ceramic cavity rim around the aperture. A temperature of around 330° C. most commonly is needed to cause the solder to flow, although there are lower temperature solders. However, the use of a lower temperature solder runs the risk that the seal will fail if the device is subjected to higher temperatures during system assembly or operation. There are also organic seal materials with can be used instead of metal solders. While the latter are often more durable, the seal they form is not hermetic. Consequently, metal solder is needed when the seal must be hermetic.

However, as the size of optical MEMS products increases, such seals no longer suffice, for multiple reasons. One reason is that a solder seal pins the edges of the optical window in place. With barometric pressure changes, the window material therefore has to bow inwardly or outwardly, with maximum flexing at the middle. This flexing introduces strain in the glass window and such glass strain, in turn, introduces errors (i.e., distortion) in optical signal transmission. If the strain gets too high, the glass may crack. The larger the size, the greater the pressure (stress) on the seal joint and on the window material itself due to mismatch of expansion coefficients, as the product temperature and barometric pressure deviate from the conditions under which the product was manufactured. Optical MEMS devices are now contemplated that are or may get to be quite large compared to conventional ICs and prior MEMS products. For example, arrays of optical elements such as mirrors (used in add/drop multiplexers, switchers, attenuators, filters and the like) could, with suitable packaging, easily be five centimeters or more on a side. This large size creates packaging demands of magnitude, if not kind, unknown in the realm of conventional ICs and MEMS packages. The magnitude of stresses on the window and on the window seal are far higher, for the same temperature swing, than much smaller ICs apply to their packaging joints. With such large packages, simple solder seals may fail and caps may crack due to high stress. Also, with such dimensions, small degrees of tilt on the window may seriously impair optical performance.

To prevent the window cracking under the higher forces which will be placed on it, one might wish to increase the thickness of the glass, but that could introduce greater optical distortion, higher losses in the glass and more thermal motion due to the increased bulk. It also would concentrate the stress on the solder joint, raising the failure rate there and/or requiring more robust joints of different construction.

Naturally, an obvious choice is to try to use materials for the cap and the cavity with closely matched coefficients of thermal expansion, to at least minimize stress due to thermal effects (notwithstanding the barometric pressure variation problem, which requires some other solution). However, cost-effective candidate materials are not plentiful in number; neither are they inexpensive. For example, a ceramic package typically will have a thermal expansion coefficient of about 6.9 to $7.2 \times 10^{-6}/°$ C. Sapphire, with a similar thermal expansion coefficient, could be used for the cap but it is quite expensive and has a high index of refraction as well as high transmission loss. Coatings can help reduce the transmission loss for normal incidence but they add cost and do nothing to reduce the refractive index, so both loss and optical path shifts are a concern for non-normal incidence. Other materials that might be considered for the cap (window) might include, for example, borosilicate glasses such as are used in EPROM windows, and zinc borosilicate and barium borosilicate such as are used in LCD's. Each has its own deficiencies and none is inexpensive.

Thus, a need exists for an improved seal and sealing technique to be used to affix a cover or window to a cavity-forming housing for a MEMS device, particularly for an optical MEMS device. Such a seal or sealing techniques must be hermetic but has to allow a considerable range of motion in the plane of the cavity aperture due to thermal effects and stresses incurred during assembly. It also must not substantially distort the optical signal or degrade the performance of the device in response to thermally-induced or atmospheric-pressure-induced stress, so it must not introduce much motion normal or oblique to the plane of the aperture. That is, it must exhibit torsional and z-axis (i.e., the axis normal to the aperture plane) stiffness. This latter requirement is particularly important with higher index window materials. Finally, it must have minimal impact on optical performance.

SUMMARY OF THE INVENTION

These and other needs are addressed, and advantages obtained, with the use of a seal employing a ring element or member between the cavity housing and the window. The ring preferably takes the form of a bellows. That is, it has a flexible portion intermediate two end portions which are used as attachment portions. One of the attachment portions is hermetically sealed, as , for example, by a solder seal, to the housing wall and the other attachment portion is hermetically sealed to the window, which typically is a glass.

According to a first aspect, the invention comprises a MEMS product comprising a housing member forming a cavity; a MEMS device disposed in the cavity of the housing member; a cap member dimensioned and configured to substantially cover the cavity in the housing member; and a sealing member sealingly attached to and between the housing member and the cap member. The sealing member is configured and arranged to be sufficiently resilient to allow motion due to differential thermal expansion between the housing member and the cap member without breaking either sealing attachment and further allowing the cap member to move in response to changes in barometric pressure In one embodiment, the sealing member has a first attachment portion operatively attached by a first hermetic seal to the housing member and a second attachment portion operatively attached to the cap member by a second hermetic seal and the sealing member is impermeable to gas flow, whereby the cavity is hermetically sealed from ambient atmosphere external to the product. In some embodiments, the MEMS device is an optical MEMS device and the cap member is an optical window member. The sealing member may be configured and arranged so that the cap member, when it moves in response to changes in barometric pressure, does not tilt the cap member.

The bellows member may in some embodiments comprise an intermediate portion between the first and second attachment portions, the intermediate portion being constructed and arranged to allow said motion.

According to another aspect, the invention comprises a seal element for use in installing a cap on a housing for a micro-device, the seal element comprising a bellows which, when used, encircles an aperture in the housing and has a first portion for attachment to the housing adjacent the aperture, a second portion for attachment to the cap and a flexible portion intermediate the first and second portions.

In some embodiments, the flexible portion of the seal element is stiffer in permitting movement in a direction normal to a plane of said aperture than in permitting movement parallel to said plane.

In yet another aspect, the invention comprises a seal member for use in a microelectronic product, said product comprising a housing forming a cavity for receiving a semiconductor device and having a wall defining an aperture through which the device is inserted, and a cap for closing the aperture, the seal member comprising a ring having a compliant portion between first and second attachment portions, and configured and arranged to encircle the aperture so that the first attachment portion can be sealingly attached to the wall and the second attachment portion can be sealingly attached to the cap, both sealing attachments being hermetic sealing attachments.

In some embodiments, the ring may be in the form of a metal bellows.

BRIEF DESCRIPTION OF THE DRAWINGS

In the drawings, like elements are indicated by like reference designators. It should not be assumed, however, that all elements which would be present in a commercial product are shown or that all elements are drawn to scale, unless otherwise noted, as the purpose of the drawings is to facilitate an explanation of the invention and not to specify any particular product. The drawings cannot show and are not intended to show all possible implementations of the invention, but only certain illustrative embodiments useful for explanatory purposes.

DETAILED DESCRIPTION

Figure 1:
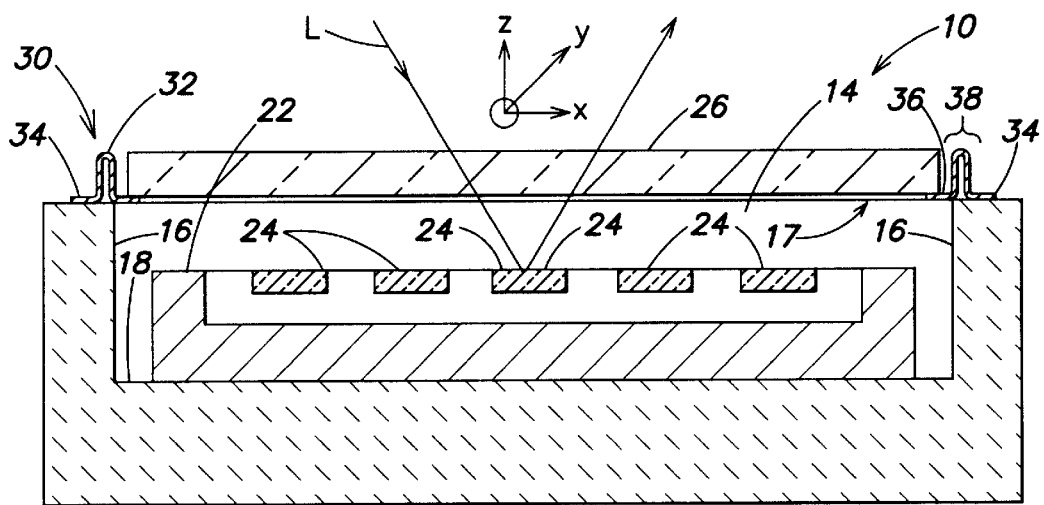
FIG. 1 is a cross-sectional view of an illustrative MEMS product (particularly an optical MEMS product) incorporating an illustrative embodiment of a seal as taught herein, taken along the section line 1—1' of FIG. 2.
Figure 2:
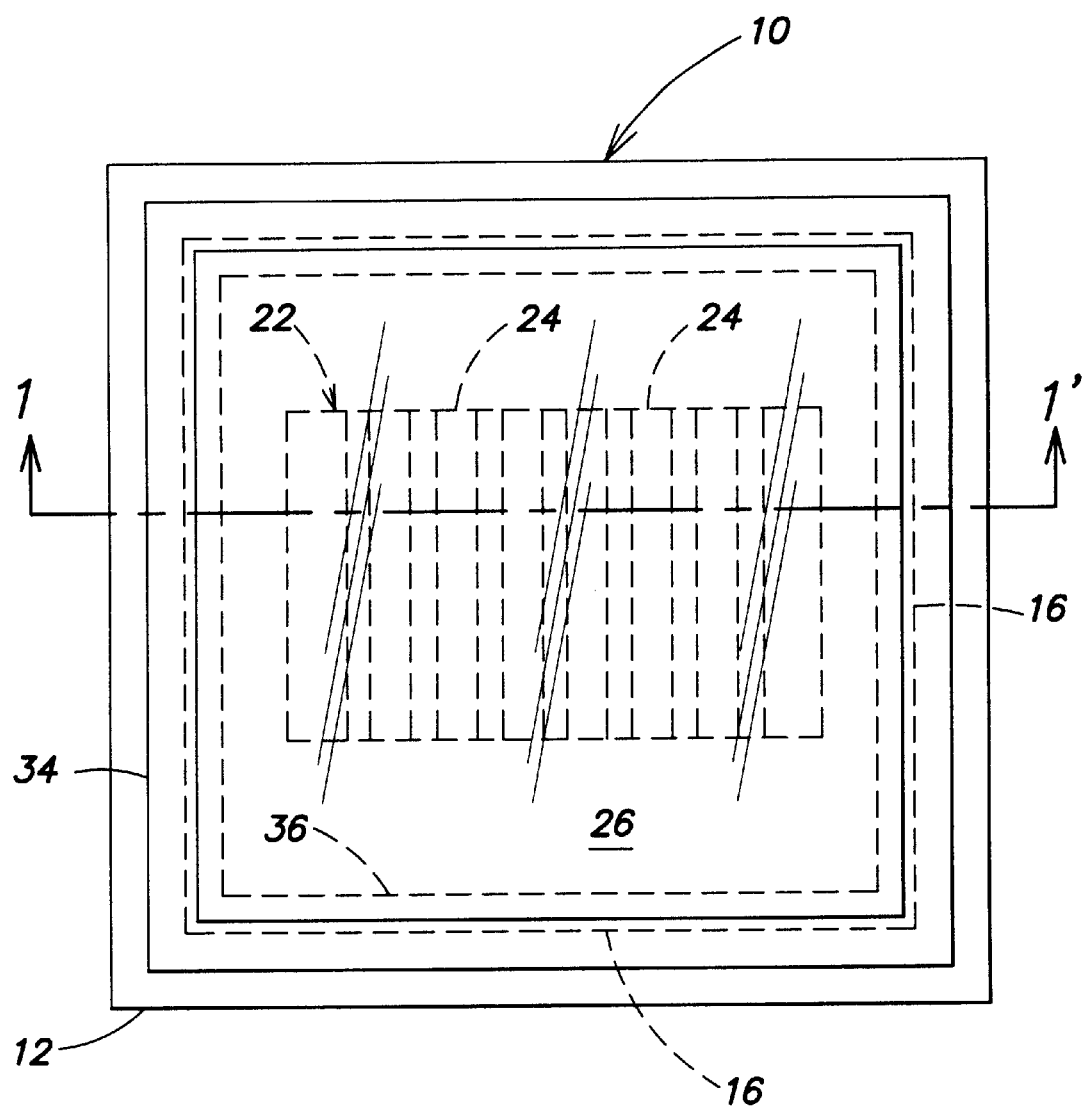
FIG. 2 is a top view of the product of FIG. 1.

Turning now to FIG. 1, there is shown a diagrammatic illustration of a cross-section of an example of an optical MEMS device 10 employing a first embodiment of a seal design as taught herein. A top view of the same device 10 is shown in FIG. 2 and it is noted there that the cross-section of FIG. 1 is taken along the line 1—1' of FIG. 2. The optical MEMS device 10 comprises a housing 12 made of, for example, a ceramic material such as alumina, $Al_2O_3$. The housing 12 is essentially a box forming a cavity 14 and having side walls 16 defining an aperture 17 open toward the top. On an interior surface 18 of the housing 12, such as an interior bottom surface, an optical MEMS chip 22 is mounted (for example, by being cemented in place) with an adhesive (not shown). A portion of an upper surface of the optical MEMS chip 22 includes one or more (typically many) mirror elements 24. The top surfaces of mirror elements 24 usually are disposed normal to the direction of an axis, drawn here as the "z" axis defining a retro-reflecting path for incident light (an angled ray of which is shown at L). An optically transparent window 26 is installed over and (fully or partially—i.e., in combination with other elements) closing aperture 17, supported by a seal structure 30. Seal structure 30 preferably comprises a seal member in the form of a ring 32 (the term "ring" being used not to suggest a circular shape but, rather, to signify that it encircles the aperture 17 even though that may be a rectangular or other non-circular-shape aperture), sealed on all sides to the window 26, on the one hand, and to the housing 12, on the other hand, by solder or other means (not shown), and having at least one flexible portion permitting it to be compliant in the x- and y-directions. More specifically, ring 32 has a first portion or footing 34 which is shaped, dimensioned and arranged to be sealingly affixed to housing 12, a second portion or footing 36 which is shaped, dimensioned and arranged to be sealingly affixed to window 26 and an intermediate portion 38 interconnecting first and second portions 34 and 36 The intermediate portion 38 has at least a section that is flexible, to accommodate thermal expansion and other mechanical stressors. The preferred material for ring 32 is a metal such as nickel alloys. The specific thickness and composition of the metal will depend on application-specific factors such as the size and shape of the ring. In the example of FIG. 1, the intermediate portion 38 is formed as a convolution or arch, though as shown below, various other arrangements will perform the intended function, as well, so the invention is not limited to a specific configuration for the ring 32. The configuration illustrated is .that of a bellows.

Note that although portions 34, 36 and 38 are shown in FIGS. 1 and 2 as parts of an integral whole, the term "portion" is used herein both to denote a part of an integral whole and a separate part that together with others forms a whole assemblage or element.

The joint between the window and the ring may be formed by first depositing a thin film of metal over the edge of the window material (a glass, typically) and them soldering the ring to the metal film. Or the window may be mounted into a metal frame (not shown) which is soldered to the ring 32. Between the ring and the cavity housing, a solder seal or seamseal is most likely to be the preferred technique for creating a hermetic attachment. Seam sealing may be performed at lower temperatures than soldering, but soldering also could be employed.

Figure 3:
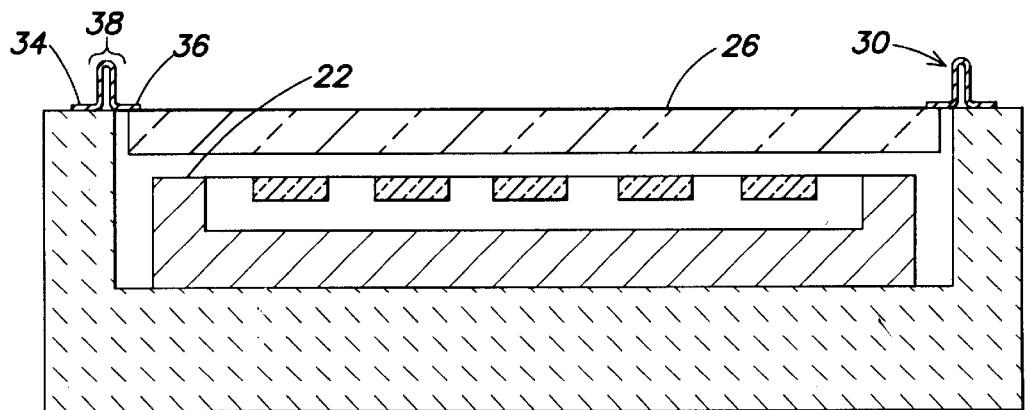
FIGS. 3 and 4 are is cross-sectional views of additional embodiments of MEMS products as taught herein.

As noted above, the ring-seal of the present invention may be practiced using many designs or embodiments differing from that shown in FIG. 1. For example, referring to FIG. 3, in one alternative embodiment the cap 26 may be attached to the bottom side of the "interior" footing (second portion) 36 of ring 32, instead of to the top side of the footing 36 as shown in FIG. 1. This allows the window to be closer to the surface of the MEMS device and thereby redGuce distortions. Of course, the same result could be achieved by reducing the height of walls 16 in FIG. 1.

Figure 4:
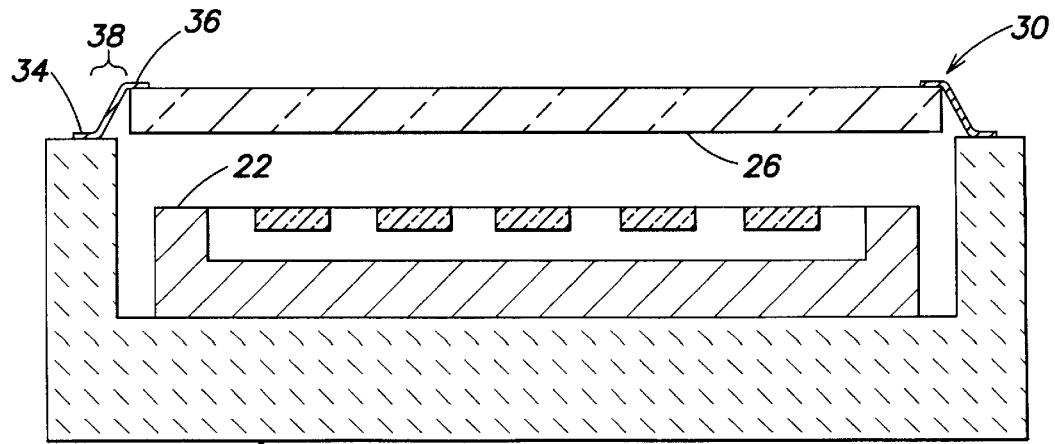

Another alternative embodiment is depicted in FIG. 4, wherein the ring 32 is shaped more like a circular leaf spring, the flexible intermediate portion 38 being approximately flat in its relaxed position (shown). Note that the window is depicted as attached to the under side of ring portion 36 but it could just as well be attached to the upper side of portion 36.

Thus, the ring 32, however configured, functions as a member or means for hermetically sealing a cap (window) to a cavity-forming housing while accommodating thermal expansion mismatch in the x and y directions. At the same time, it is preferably compliant but stiffer in the z-axis direction. Different embodiments will, obviously, exhibit different degrees of stiffness and compliance. Moreover, by virtue of its symmetry, ring 32 should allow the window to tilt very little, even during z-axis motion. The ring 32 is, in fact, a kind of bellows, allowing both a vertical "breathing" motion of the window in response to applied (barometric or other) pressures and horizontal (x-directed and/or y-directed) in response to thermal expansion differentials. The compliance of the ring 32 relieves the stress that otherwise would be borne by the seals on the window periphery and on the housing; and since the window edge is allowed to move, the window can maintain flatness and avoid undesirable stress fracturing.

The ring 32 may be formed using any suitable material, preferably a metal or metal alloy or multiple layers and/or pieces of material, using any suitable manufacturing technique. For example, the ring may be stamped or drawn from sheet metal or plated or fabricated from stamped segments that are welded or brazed together to form ring 32. The ring need not be of uniform thickness or composition. As mechanical stresses will be highest where the radius of curvature is smallest (i.e., at the corners), it may prove beneficial to make the ring thicker or to treat the material differently or to make it of different composition or structure in such areas. These variations, and their value and benefit, will be application-dependent.

While there have been shown certain illustrative embodiments for the ring 32, those embodiments are not intended to be limiting or exhaustive. Rather, they are presented by way of example, only. A seal as taught herein also may be formed using rings of such other designs and constructions as may occur to those skilled in the art, consistent with the teachings expressed herein. The ring which forms the "heart" : of the seal may be of single piece construction or it may be formed of two or more separate pieces. It may be square or rectangular as illustrated, or it may take on other geometries, as required by the shape and dimensions of the housing aperture and cap. In the examples shown, the housing aperture is bounded by a planar surface to which the ring is attached. If the surface to which the ring is to be secured is not planar, then either the ring geometry has to be suitably adapted or an adapter must be employed between the housing member and the ring, to create a suitable attachment surface allowing a hermetic seal. For simplicity of explication, a housing member together with an adapter shall also be called a housing member for purposes of this discussion.

Other details of the illustrative implementations are likewise intended to be presented as examples only. Variations and improvements will readily occur to those skilled in the arts of integrated circuit and MEMS device packaging, and such variations and improvements are intended to be suggested hereby. Accordingly, the invention is not intended to be limited by this specification or by the accompanying drawings, but only as required by the appended claims and equivalents thereto.

What is claimed is:

1. A MEMS product comprising:

a housing member forming a cavity;

a MEMS device disposed in the cavity of the housing member;

a cap member dimensioned and configured to substantially cover the cavity in the housing member; and a sealing member sealingly attached to and between the housing member and the cap member and configured and arranged to be sufficiently resilient to allow motion due to differential thermal expansion between the housing member and the cap member without breaking either sealing attachment and allowing the cap member to move in response to changes in barometric pressure.

2. The MEMS product of claim 1 wherein the sealing member has a first attachment portion operatively attached by a first hermetic seal to the housing member and a second attachment portion operatively attached to the cap member by a second hermetic seal and the sealing member is impermeable to gas flow, whereby the cavity is hermetically sealed from ambient atmosphere external to the product.

3. The MEMS product of claim 1 or claim 2 wherein the MEMS device is an optical MEMS device and the cap member is an optical window member.

4. The MEMS product of claim 3 wherein the sealing member is configured and arranged so that the cap member, when it moves in response to changes in barometric pressure, does not tilt the cap member.

5. The MEMS product of claim 2 wherein the sealing member further comprises an intermediate portion between the first and second attachment portions, the intermediate portion being constructed and arranged to allow said motion.

6. A seal element for use in installing a cap on a housing for a micro-device, the seal element comprising a bellows which, when used, encircles an aperture in the housing and has a first portion for attachment to the housing adjacent the aperture, a second portion for attachment to the cap and a flexible portion intermediate the first and second portions.

7. The seal element of claim 6 wherein the flexible portion is stiffer in permitting movement in a direction normal to a plane of said aperture than in permitting movement parallel to said plane.

8. A seal member for use in a microelectronic product, said product comprising a housing forming a cavity for receiving a semiconductor device and having a wall defining an aperture through which the device is inserted, and a cap for closing the aperture, the seal member comprising:

a ring having a compliant portion between first and second attachment portions, and configured and arranged to encircle the aperture so that the first attachment portion can be sealingly attached to the wall and the second attachment portion can be sealingly attached to the cap, both sealing attachments being hermetic sealing attachments.

9. The seal member of claim 8 wherein the ring is in the form of a metal bellows.

* * * * *